US010641978B2

(12) United States Patent
Rutowicz et al.

(10) Patent No.: US 10,641,978 B2
(45) Date of Patent: May 5, 2020

(54) DISTRIBUTION POINT UNIT FOR COUPLING EXTERNAL ELECTRICAL AND OPTICAL CABLES

(71) Applicant: Corning Optical Communications LLC, Charlotte, NC (US)

(72) Inventors: Lukasz Jan Rutowicz, Lodz (PL); Martin Spreemann, Berlin (DE)

(73) Assignee: Corning Optical Communications LLC, Charlotte, NC (US)

( * ) Notice: Subject to any disclaimer, the term of this patent is extended or adjusted under 35 U.S.C. 154(b) by 0 days.

(21) Appl. No.: 16/557,509

(22) Filed: Aug. 30, 2019

(65) Prior Publication Data

US 2019/0384028 A1 Dec. 19, 2019

Related U.S. Application Data

(63) Continuation of application No. 15/771,171, filed as application No. PCT/US2016/055490 on Oct. 5, 2016, now abandoned.

(30) Foreign Application Priority Data

Oct. 27, 2015 (EP) .................................. 15191709

(51) Int. Cl.
*G02B 6/44* (2006.01)
*G02B 6/42* (2006.01)
*H05K 7/20* (2006.01)

(52) U.S. Cl.
CPC .......... *G02B 6/4448* (2013.01); *G02B 6/428* (2013.01); *G02B 6/4269* (2013.01); *G02B 6/4272* (2013.01); *G02B 6/4454* (2013.01); *H05K 7/20436* (2013.01)

(58) Field of Classification Search
None
See application file for complete search history.

(56) References Cited

U.S. PATENT DOCUMENTS

| 4,679,896 A | 7/1987 | Krafcik et al. |
| 4,861,134 A | 8/1989 | Alameel et al. |
| 5,267,122 A | 11/1993 | Glover et al. |
| 5,384,940 A | 1/1995 | Soule et al. |

(Continued)

FOREIGN PATENT DOCUMENTS

JP 2002315172 A 10/2002

OTHER PUBLICATIONS

International Search Report and Written Opinion of the International Searching Authority; PCT/US2016/55490; dated Jan. 9, 2017; 11 Pages; ISA/US Commissioner for Patents.

(Continued)

*Primary Examiner* — Michael Stahl
(74) *Attorney, Agent, or Firm* — Tamika A. Crawl-Bey

(57) ABSTRACT

A distribution point unit for coupling an external electrical and optical cable comprises a casing comprising a first port to receive the external optical cable and a second port to receive the external electrical cable. The distribution point unit comprises an electronic board comprising electronic components and at least one heat transferring device. A tray comprises at least one hole to receive a section of the at least one heat transferring device. The at least one heat transferring device is thermally coupled to at least one of the electronic components to thermally couple the at least one electronic component to the casing.

15 Claims, 8 Drawing Sheets

(56) References Cited

U.S. PATENT DOCUMENTS

| | | |
|---|---|---|
| 5,436,997 A | 7/1995 | Makiuchi et al. |
| 5,515,200 A | 5/1996 | Delrosso et al. |
| 5,659,641 A | 8/1997 | Demeritt et al. |
| 5,982,972 A | 11/1999 | Tucker et al. |
| 6,317,325 B1 | 11/2001 | Patel et al. |
| 6,741,785 B2 | 5/2004 | Barthel et al. |
| 6,807,218 B1 | 10/2004 | Greenwood et al. |
| 7,272,009 B2 | 9/2007 | Sura et al. |
| 2003/0007717 A1 | 1/2003 | Chiappetta et al. |
| 2003/0068141 A1 | 4/2003 | Velsher et al. |
| 2003/0169983 A1 | 9/2003 | Branch et al. |
| 2007/0248358 A1 | 10/2007 | Sauer |
| 2015/0078408 A1 | 3/2015 | Bukkems |
| 2018/0045906 A1 | 2/2018 | Cams et al. |

OTHER PUBLICATIONS

Bernquist; Thermal Materials; Thermal Solutions; Henkel; 2018; 2 Pages.
Written Opinion for EP1591709.3 dated Apr. 29, 2016; European Patent Office; 3 Pgs.

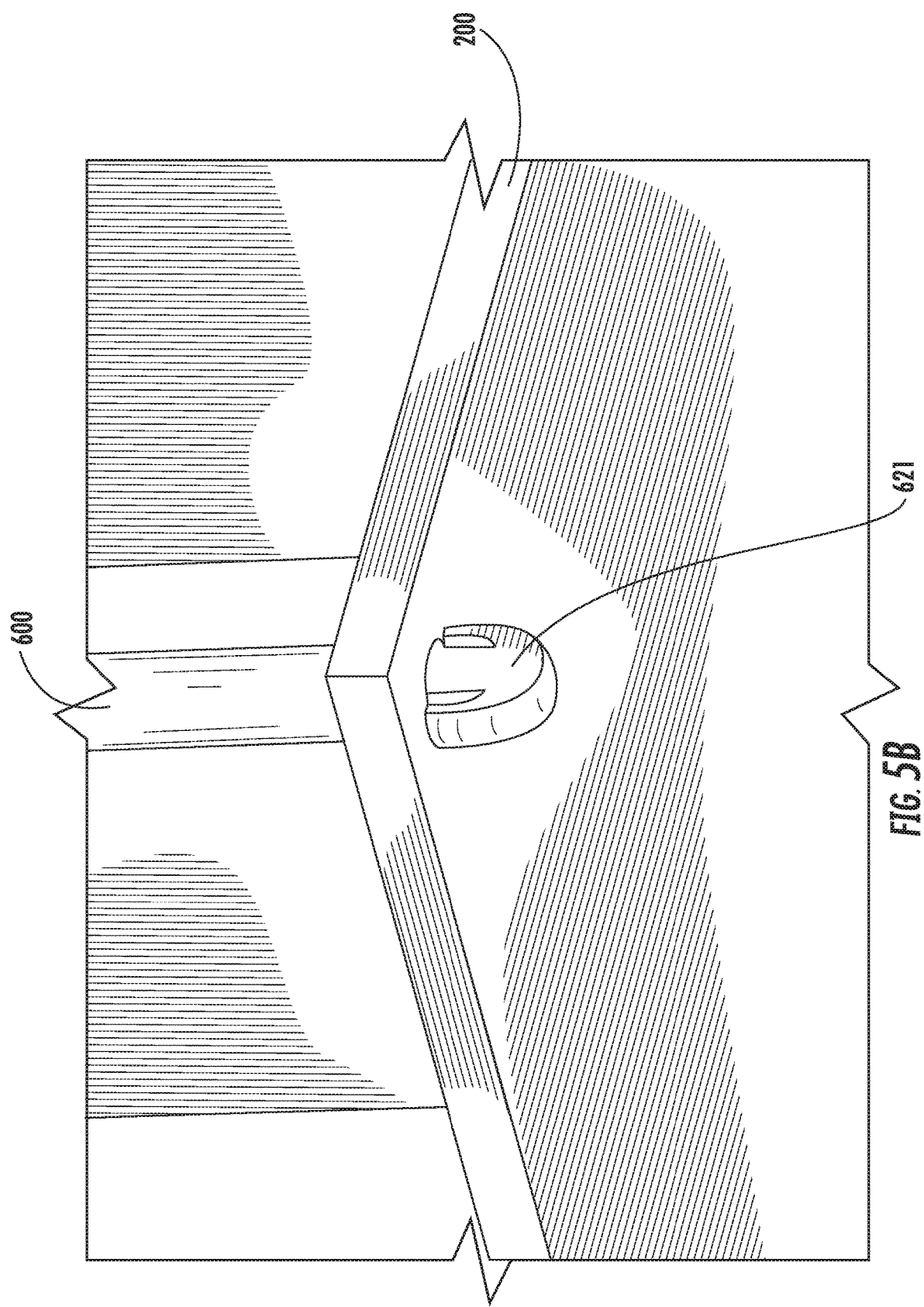

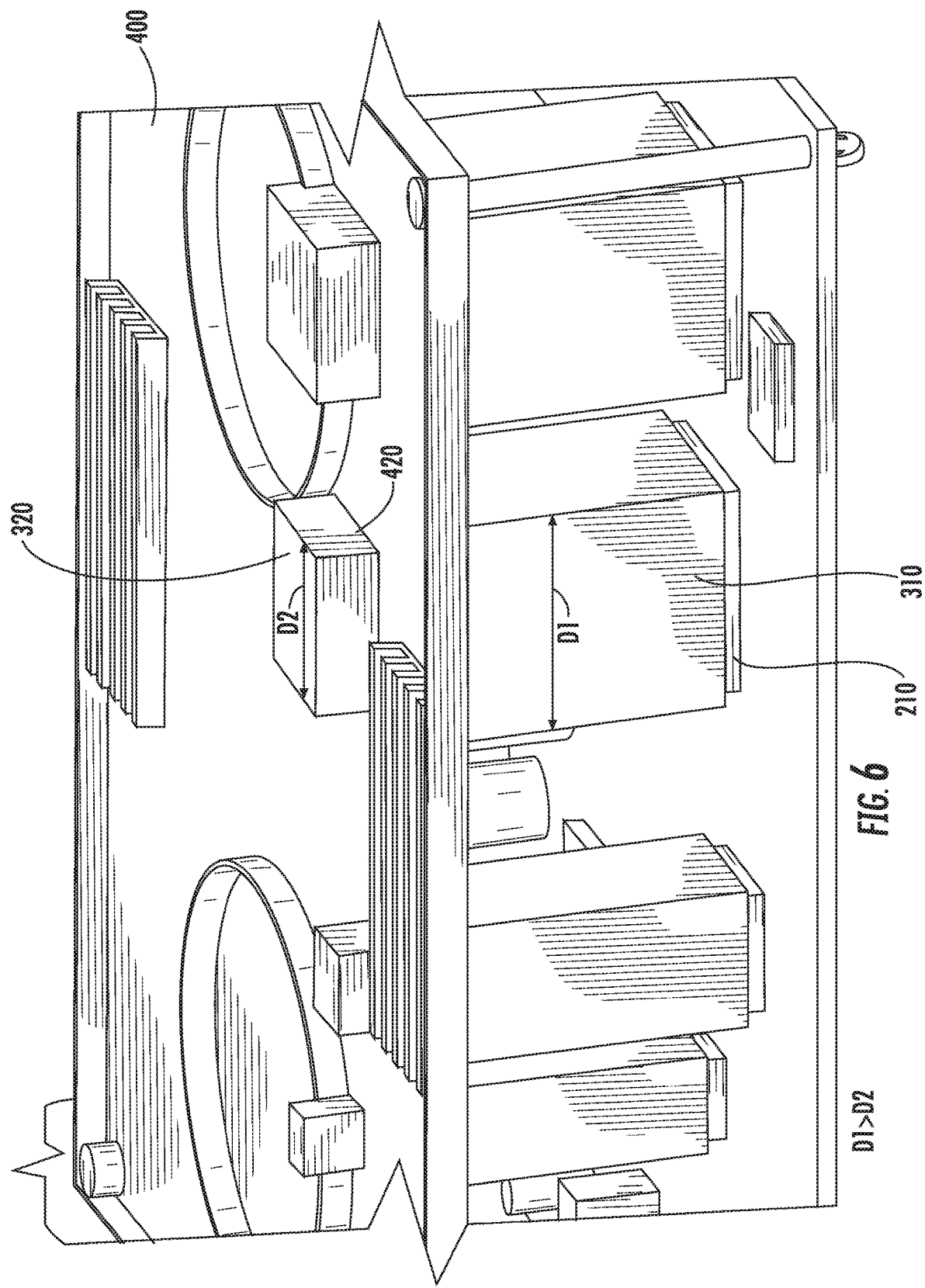

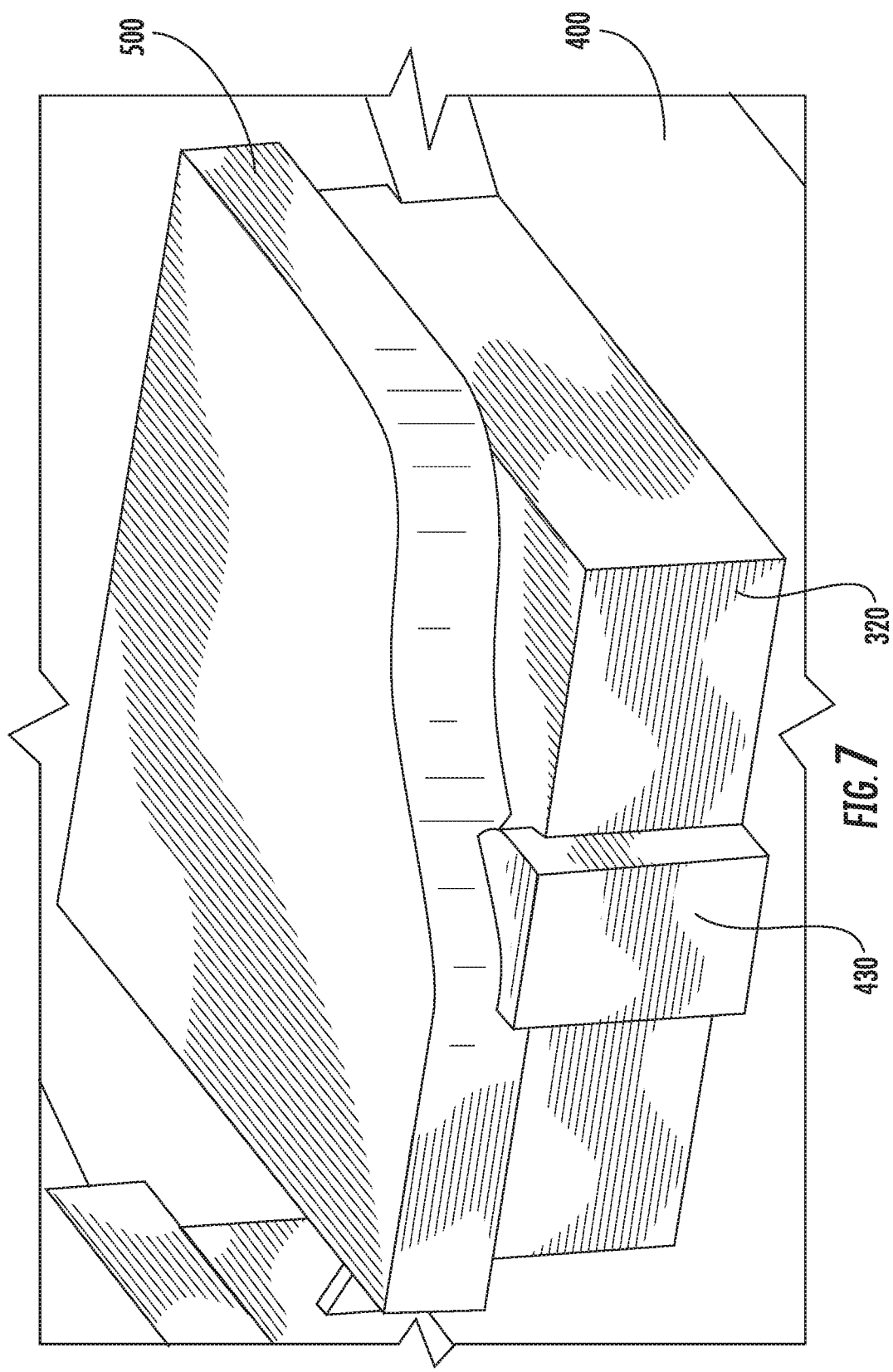

DISTRIBUTION POINT UNIT FOR COUPLING EXTERNAL ELECTRICAL AND OPTICAL CABLES

CROSS REFERENCE TO RELATED APPLICATIONS

This application is a continuation of U.S. application Ser. No. 15/771,171 filed on Apr. 26, 2018, which is a 371 of PCT/US16/55490 filed on Oct. 5, 2016, which claims the benefit of priority to European Application No. 15191709.3 filed on Oct. 27, 2015, the content of each is relied upon and incorporated herein by reference in their entireties.

BACKGROUND

Optical access networks connect subscribers of high bandwidth telecommunication services to their providers. Because of its high dependency on building access and infrastructure, the best performing, all optical, fiber to the home (FTTH) model has problems being accepted by the market, in particular since a possible bandwidth of up to 100 Gb/s is often not needed. Fiber to the cabinet (FTTC) is a much more cost-efficient model. It connects the existing street cabinet of the legacy copper cable infrastructure with optical fibers to a central office. The cabinets are equipped with optical network units (ONU) that perform the opto-electrical conversion and VDSL modems. The subscriber's VDSL modems are connected to the cabinets using the legacy copper infrastructure. In this model, the distance of the cabinets to the subscribers which is usually lower than 400 m limits the possible bandwidth to 50-100 Mb/s.

Another technology is based on the fiber to the distribution point (FTTdp) architecture and brings the fiber optic cable closer to the subscriber than the technology based on fiber to the cabinet (FTTC) architecture, but still uses the existing copper cable infrastructure for the last 100 m from a fiber distribution point to a subscriber. It is assumed that in the future the FTTdp architecture will be the favoured technology for optical access networks, since it allows increased bandwidth but still no optical fiber has to be employed in the building infrastructure.

However, the FTTdp architecture also brings challenges for the active distribution point equipment (DPE). The distribution point is the place in the optical network at which a subsequent fiber optic cable usually coming from an optical splitter at which a main fiber optic cable coming from the provider/central office is split to different ones of the subsequent fiber optic cable is coupled to an electrical cable of the legacy copper cable infrastructure. The electrical cable is connected to the home of the subscriber. The distribution point equipment is provided in a distribution point unit.

Instead of using large scale environmentally protected cabinets as usually utilized for housing the Distribution Point Equipment (DPE) in the fiber to the cabinet (FTTC) architecture, in case of the fiber to the distribution point (FTTdp) model, the equipment is deployed in much rougher and size-constrained environmental conditions like handholds. The usage of hardened fiber optical connectors (HFOC) providing sufficient water—and thus protection—is mandatory for every outside plant (OSP) environment. However, some of the active electronic devices, for example microchips, incorporated in a distribution point unit also require proper thermal management which is a major challenge because of size constraints.

Heat removal from electronic components that are deployed in protected environments mostly relies on natural or forced convection of air through a finned heat exchange body. The input air gets heated in a heat-exchanger and is removed away from the heat source. However, in a buried underground deployment scenario with sealed enclosures as the distribution point unit in a fiber to the distribution point network, air exchange is not possible so that convective heat dissipation is not very efficient.

It is desired to provide a distribution point unit for coupling an external electrical and optical cable that allows the processing of opto-electrical signals as well as cable routing and fiber splice protection functionality in a small constructed space and provides an efficient heat dissipation.

SUMMARY

Embodiments of a distribution point unit for coupling an external electrical and optical cable are described herein. The distribution point unit may provide processing of optical/electrical signals as well as efficient heat dissipation. For example, the distribution point unit may include a casing having a first port to receive the external optical cable and a second port to receive the external electrical cable; an electronic board including at least an electronic component for processing optical and/or electrical signals, wherein the electronic board is housed within the casing; at least one heat transferring device having a first section with a first end and an adjacent second section with a second end, wherein the at least one heat transferring device is housed by the casing; a tray arranged above the electronic board, wherein the tray comprises at least one hole completely penetrating the tray from an upper surface of the tray to an opposite lower surface of the tray directed to the electronic board to receive the second section of the at least one heat transferring device, wherein the tray is housed by the casing. In some embodiments, the first end of the at least one heat transferring device is thermally coupled to the at least one electronic component. In some embodiments, the second end of the at least one heat transferring device is thermally coupled to the casing.

The distribution point unit for coupling an external electrical and optical cable may include a casing comprising a first port to receive the external optical cable and a second port to receive the external electrical cable. The distribution point unit may further include an electronic board comprising at least an electronic component for processing optical and/or electrical signals. The electronic board is housed within the casing. The distribution point unit may also include at least one heat transferring device having a first section with a first end and an adjacent second section with a second end. The at least one heat transferring device may be housed by the casing.

The distribution point unit may include a tray arranged above the electronic board. The tray may include at least one hole completely penetrating the tray from an upper surface of the tray to an opposite lower surface of the tray directed to the electronic board to receive the second section of the at least one heat transferring device. The tray is housed by the casing.

The first end of the at least one heat transferring device is thermally coupled to the at least one electronic component. The second end of the at least one heat transferring device is thermally coupled to the casing.

BRIEF DESCRIPTION OF THE DRAWINGS

FIG. 5A and FIG. 5B illustrate a locking mechanism to fix the tray with splice protection and cable routing functionality to the electronic board.

FIG. 6 shows a first embodiment of a tray having the functionality to press a heat transferring device against microchips of the electronic board by a defined contact pressure.

FIG. 7 shows a second embodiment of a tray having the functionality to press a heat transferring device to a microchip with defined contact pressure.

DETAILED DESCRIPTION

The distribution point unit for coupling an external electrical and optical cable will now be described in more detail hereinafter with reference to the accompanying drawings showing different embodiments of the distribution point unit. The distribution point unit may, however, be embodied in many different forms and should not be construed as limited to the embodiments set forth herein; rather, these embodiments are provided so that the disclosure will fully convey the scope of the distribution point unit to those skilled in the art. The drawings are not necessarily drawn to scale but are configured to clearly illustrate the distribution point unit.

Figure 1:
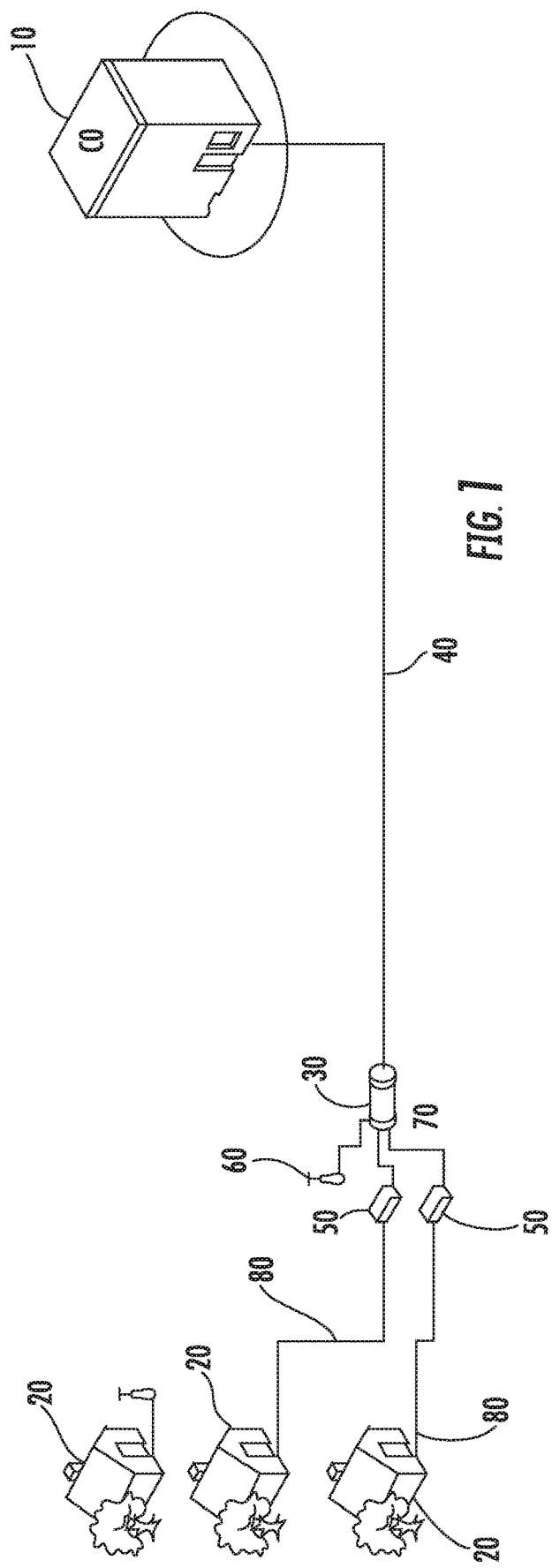
FIG. 1 shows an embodiment of a fiber to the distribution point deployment scheme.

FIG. 1 shows an architecture of an optical access network according to the fiber to the distribution point (FTTdp) deployment scheme. A central office/provider 10, for example, configured as a backbone to provide internet access to different subscribers 20 is coupled via a fiber optic cable 40 to an optical splitter 30. The optical splitter 30 is connected to distribution point units 50 by fiber optic cables 70. The distribution point units 50 are electrically coupled by an existing copper cable infrastructure 80 to the subscribers 20. Another output side of the optical splitter 30 is coupled by a fiber optic cable 80 to an antenna 60 to provide wireless access for a subscriber to the telecommunications network.

The distribution point units 50 are respectively configured as an interface for coupling the optical cables 70 to the electrical cables 80. The distribution point units 50 respectively comprise an electronic board within their casings. The electronic board comprises microchips, for example electronic components for processing optical and/or electrical signals. Furthermore, the distribution point units respectively have to provide a cable routing functionality and a splice protection functionality. The electronic components, for example the incorporated microchips, require proper thermal management to prevent damage to the electronic devices due to overheating.

Figure 2:
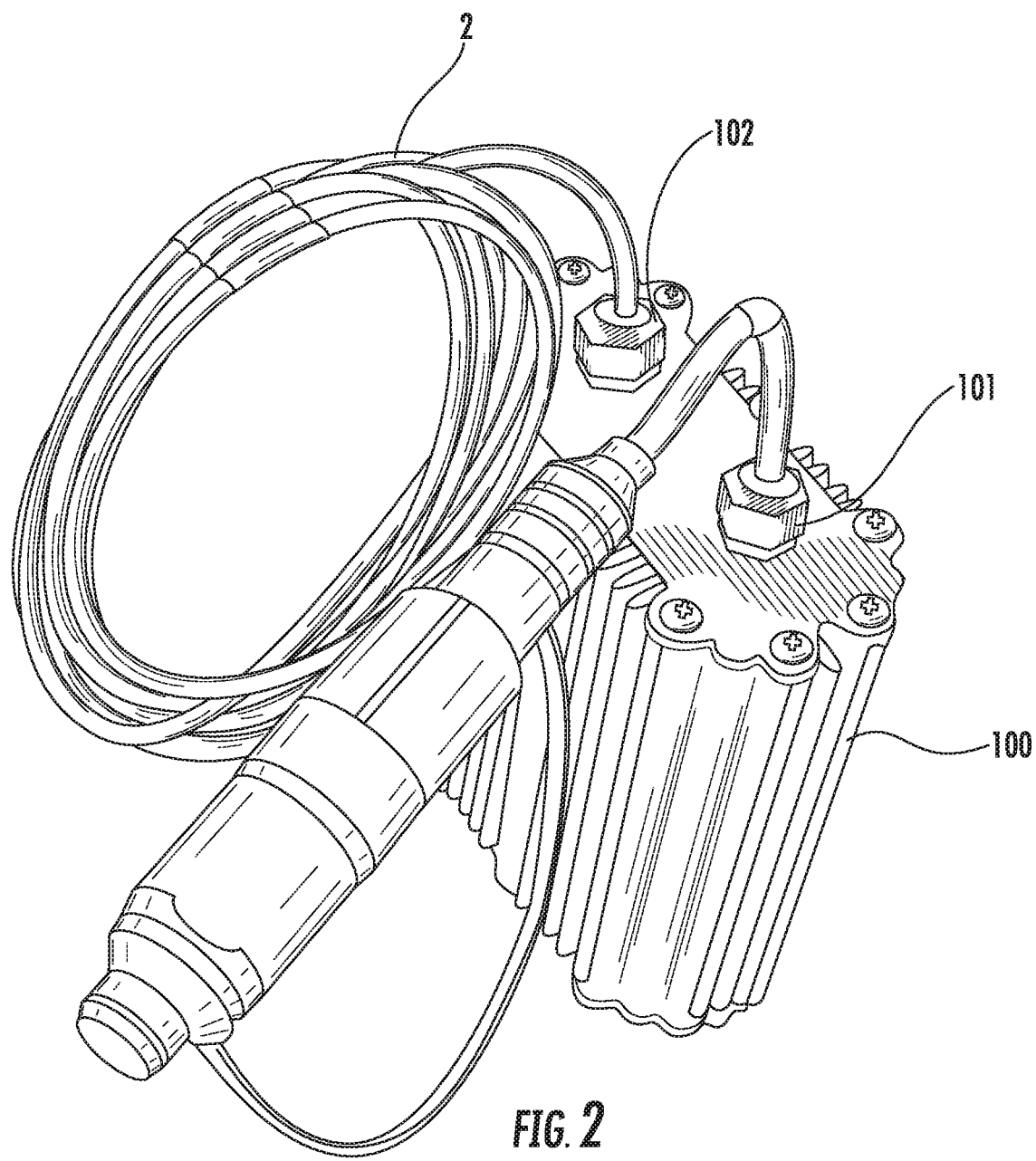
FIG. 2 shows an embodiment of an enclosure of a distribution point unit for buried deployment
Figure 3:
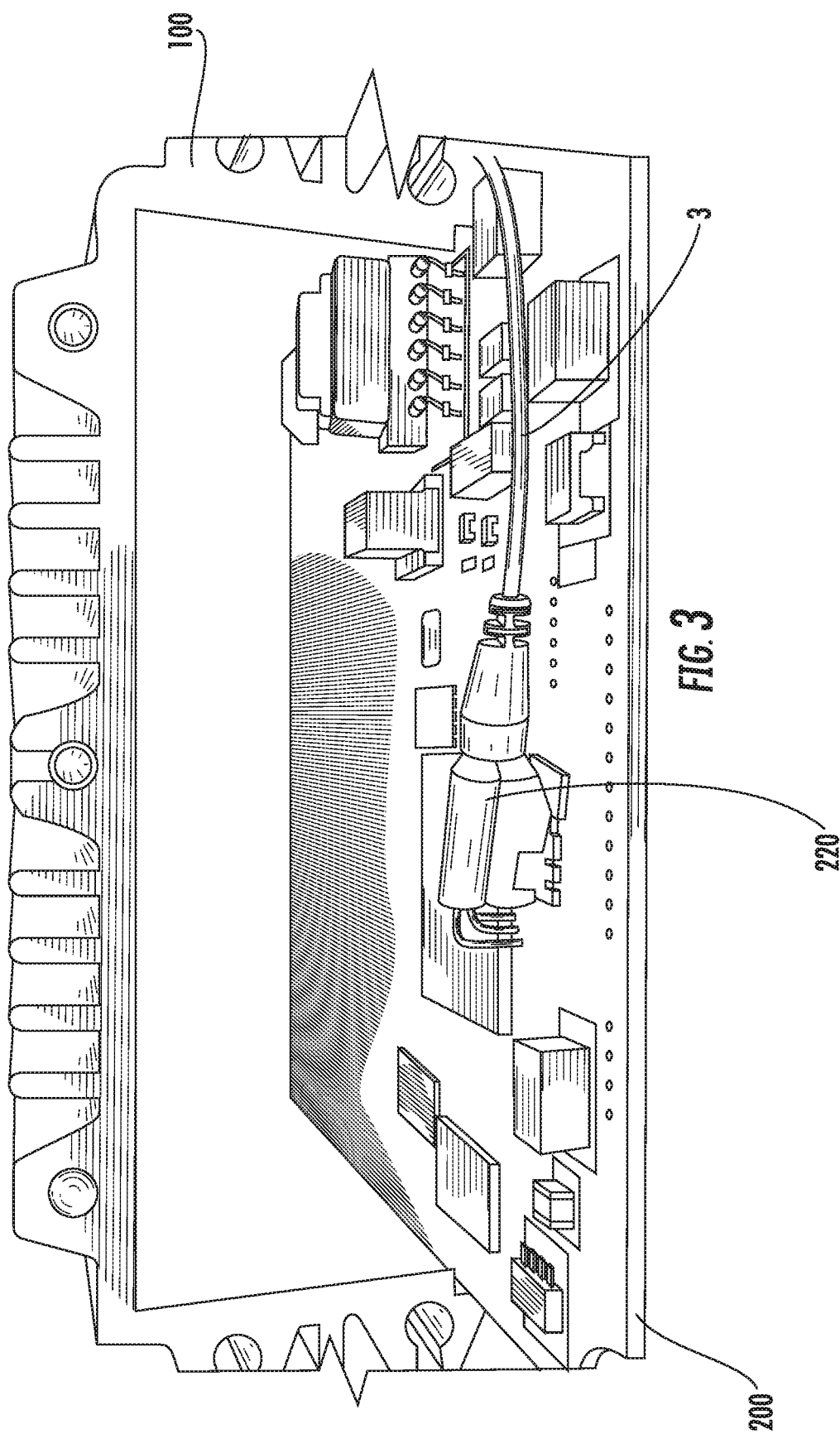
FIG. 3 shows an electronic board to be inserted in a casing of a distribution point unit.
Figure 4:
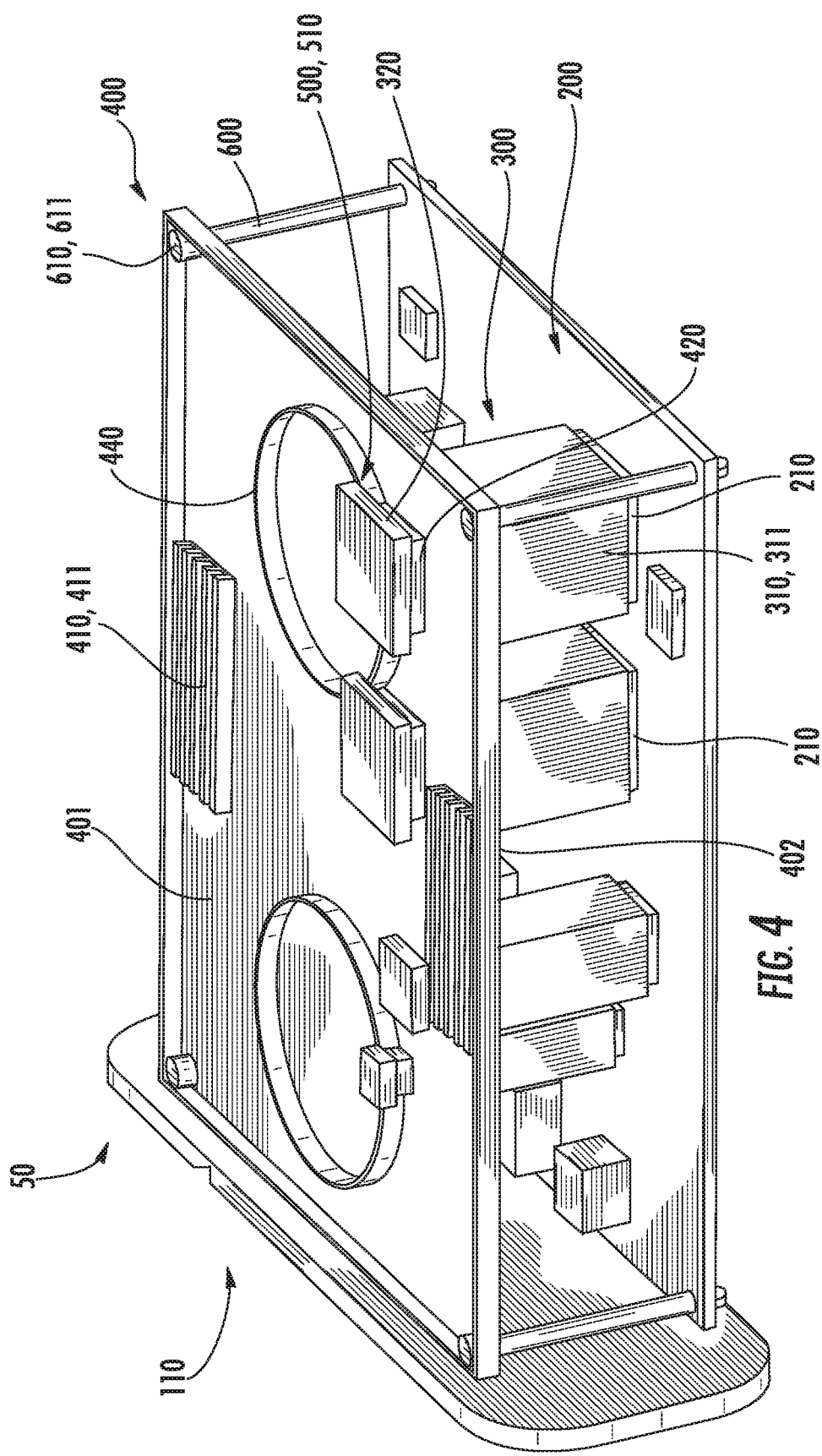
FIG. 4 shows an embodiment of an electronic board and a tray with splice protection and cable routing functionality and heat transferring devices to provide a conductive heat sink for microchips of the electronic board.

FIG. 2 shows an embodiment of an enclosure of a distribution point unit for buried deployment. FIG. 3 shows an opened casing of a distribution point unit with a front panel removed and an electronic board 200 to be placed inside the casing 100 of the distribution point unit. FIG. 4 shows a possible embodiment of an electronic board 200 and a tray 400 with cable routing and splice protection functionality as well as heat dissipation functionality to thermally couple the electronic components of the electronic board 200 to the casing 100 of the distribution point unit to prevent any damage to the electronic components by overheating.

As shown in FIGS. 2 to 4 the distribution point unit for coupling an external electrical cable 2 to an external optical cable 1 comprises a casing 100. The casing 100 comprises a first port 101 to receive the external optical cable 1 and a second port 102 to receive the external electrical cable 2. The external optical cable 1 may be coupled by an external optical connector to the fiber optic cable 40 shown in FIG. 1. The external electrical cable 2 may correspond to the electrical cable 80 shown in FIG. 1. The distribution point unit further comprises the electronic board 200. The electronic board 200 comprises electronic components 210 for processing optical and/or electrical signals. The electronic board 200 is housed within the casing 100.

The distribution point unit further comprises at least a heat transferring device 300 having a first section 310 with a first end 311 and an adjacent second section 320 with a second end 321. The at least one heat transferring device 300 is housed by the casing 100. The distribution point unit further comprises a tray 400 arranged above the electronic board 200. The tray 400 comprises at least a hole 420 completely penetrating the tray 400 from an upper surface 401 of the tray to an opposite lower surface 402 of the tray directed to the electronic board 200 to receive the second section 320 of the at least one heat transferring device 300. The second end 321 of the at least one heat transferring device 300 protrudes out of the at least one hole 420 of the tray 400. The tray 400 is housed by the casing 100.

The distribution point unit further comprises an internal optical cable 3 arranged within the casing 100. The internal optical cable 3 shown in FIG. 3 is coupled to the external optical cable 1 at a splicing area of the external and internal optical cables. The splicing area is held at the tray 400 by the splice protection device 410. The internal optical cable 3 is coupled to the electronic board 200 by means of an optical transceiver 220. The electrical cable 2 is coupled to one of the electronic components 210 being configured as an electrical transceiver.

The first end 311 of the at least one heat transferring device 300 is thermally coupled to at least one of the electronic components 210. To this purpose, the first end 311 of the at least one heat transferring device 300 touches the outer surface of the respective housing of the the at least one electronic component 210. The second end 321 of the at least one heat transferring device 300 is thermally coupled to the casing 100.

The electronic board 200 and the tray 400 are housed by the casing 100 and are hermetically sealed in the casing 100. The microchips, for example the at least one electronic component 210 for processing optical and/or electrical signals, require proper thermal management. Because of the limited efficiency of convective cooling, due to the sealed closure, heat transferring devices 300 are used to provide a conductive heat transfer to the surface of the enclosure/casing 100. The conductive heatsink bodies of the heat transferring devices 300 are placed in openings/holes 420 of the tray 400 at projected positions of the electronic components 210 that require heat removal. The at least one heat transferring device 300 is configured as a block of a thermally conductive material, for example as a block of aluminum.

According to a further embodiment of the distribution point unit, the distribution point unit may comprise a thermal bridging material 500 being arranged within the casing 100 between the second end 321 of the at least one heat transferring device 300 and the casing 100 to thermally couple the at least one heat transferring device 300 to the casing 100. The thermal bridging material 500 may be configured as a compressible thermally conductive pad 510 arranged in a gap between the second end 321 of the at least one heat transferring device 300 and the casing 100.

According to another possible embodiment, instead of using a compressible thermally conductive pad, a gel-like gap-filling material could be used in the gap between the second end 321 of the at least one heat transferring device 300 and the casing 100 to thermally couple the at least one heat transferring device 300 to the enclosure/casing 100.

As shown in FIG. 4, the tray 400 comprises a cable routing device 440 arranged on the upper surface 401 of the tray 400. The cable routing device 440 may be configured as a circular ring of the material of the tray 400.

The internal optical cable 3 is arranged within the casing 100 and coupled to the external optical cable 1 at a splicing area of the external and internal optical cable. The tray 400 comprises a splice protection device 410. The splicing area is held at the tray 400 by the splice protection device 410. As shown in FIG. 4, the splice protection device 410 may be configured as a structure with grooves 411 to insert a spliced area of the external optical cable 1 and the internal optical cable 3. The external optical cable 1 and the internal optical cable 3 are spliced together at the spliced area. The splice protection device 410 protects the spliced area of the external and internal optical cables 1 and 3 and additionally provides a strain-relief element for the optical cables to prevent any damage at the coupling zone of the internal optical cable 3 to the optical transmitter 220.

The tray 400 may be formed as a monolithic component including the splice protection device 410 and the cable routing device 430. The splice protection device 410 and the cable routing device 430 may be arranged on the top surface 401 of the tray. The tray 400 may be made of a thermoplastic material which comprises the structures of the splice protection device 410 and the cable routing device 430 as molded components.

The distribution point unit further comprises at least one spacer 600 being arranged between the tray 400 and the electronic board 200 to arrange the tray 400 in a distance defined by the spacer 600 far away from the electronic board 200. According to the embodiment of the sub-assembly shown in FIG. 4, four spacers 600 are provided which keep the tray 400 in a defined distance far away from the electronic board 200.

Figure 5A:
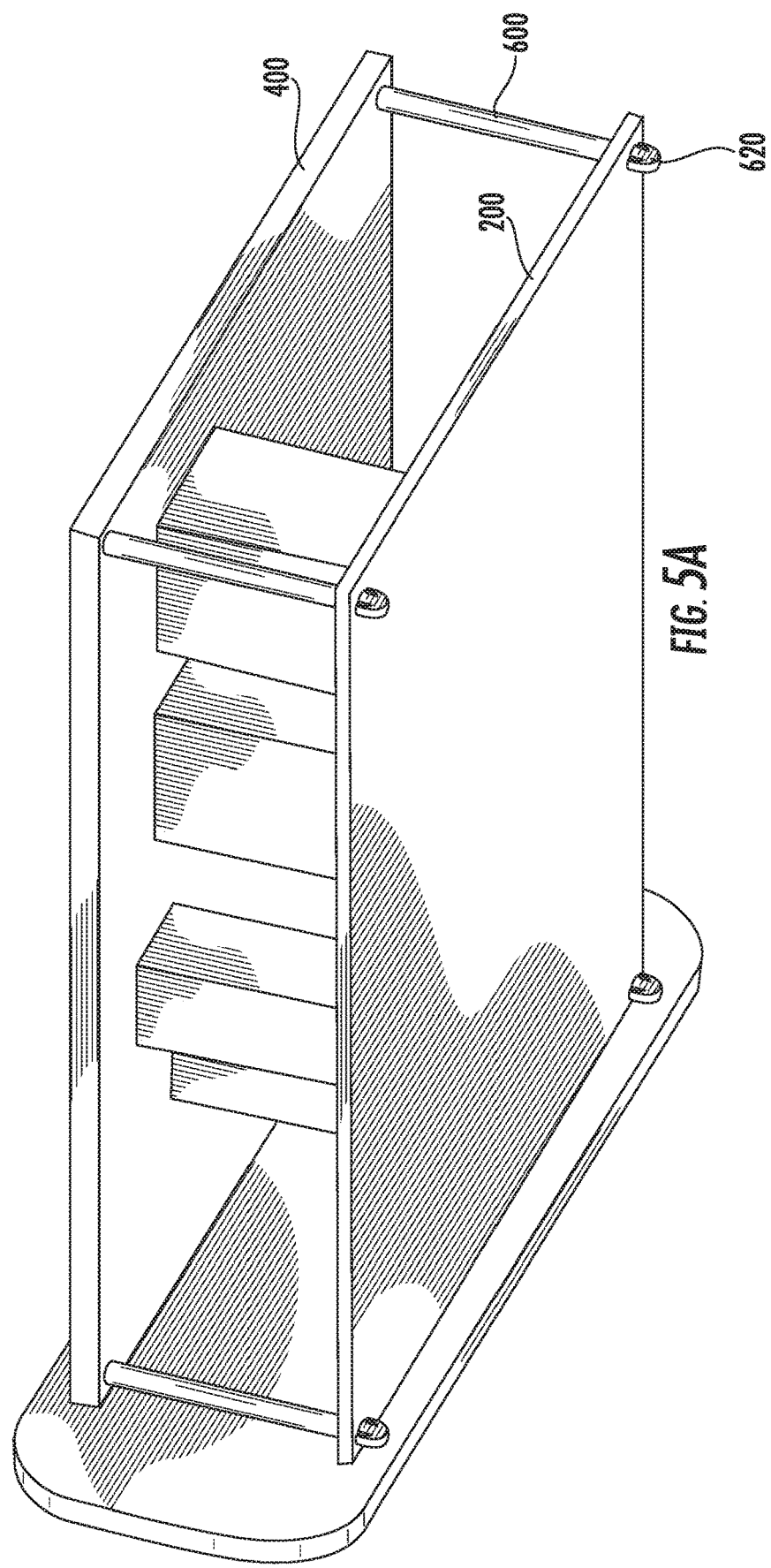

FIGS. 5A and 5B show an embodiment of a self-locking mechanism of the spacers 600 to fix the tray 400 to the electronic board 200 and to provide a distance between the tray 400 and the electronic board 200 defined by the respective length of the spacers. The at least one spacer 600 may be configured as a post having a first end section 610 penetrating the tray 400 and a second end section 620 penetrating the electronic board 200. The first end section 610 of the post comprises an expanded head 611 arranged above the upper surface 401 of the tray to fix the post to the tray 400. The second end section 620 comprises a self-locking means 621 to fix the post to the electronic board 200.

According to an embodiment of the distribution point unit, the tray 400 provides a defined contact pressure between the heatsink of the heat transferring devices 300 and the electronic components 210 of the electronic board 200 that is required for sufficient thermal contact. The tray 400 and the at least one heat transferring device 300 are configured such that the at least one heat transferring device 300 is pressed against the at least one electronic component 210 by the defined contact pressure. This is done by a mechanical stop for the heatsinks in vertical direction at the tray 400 in combination with a mechanical snatch for a self-locking of the tray 400 on the electronic board 200.

FIGS. 6 and 7 show two different embodiments of the heatsink stop. FIG. 6 shows an embodiment of the heat transferring devices 300 with a change in the geometry of the heatsink. The circuit-board sided part/first section 310 of the heat transferring device 300 shown in FIG. 6 is wider than the enclosure-sided part/second section 320 of the heat transferring device 300. According to a possible embodiment of the distribution point unit, a cross-section of the first section (circuit-board sided part) 310 of the at least one heat transferring device 300 being perpendicularly oriented to the longitudinal direction of the at least one heat transferring device 300 has a larger area than a cross-section of the second section (enclosure-sided part) 320 of the at least one heat transferring device 300 being perpendicularly oriented to the longitudinal direction of the heat transferring device 300.

The cross-section of the hole 420 of the tray 400 being perpendicularly oriented to the longitudinal direction of the second section 320 of the at least one heat transferring device 300 has a smaller area than the area of the cross-section of the first section 310 of the at least one heat transferring device 300. The configuration of the at least one heat transferring device 300 having different diameters D1 and D2 in combination with the holes 420 of the tray allows that the at least one heat transferring device 300 is pressed with its lower end 321 against the top surface of the electronic components 210 by a defined contact pressure, when the tray 400 is fixed to the electronic circuit board 200 by means of the at least one spacer 600.

According to the embodiment of the distribution point unit shown in FIG. 7, the distribution point unit comprises a clamping device 430 being arranged on the upper surface 401 of the tray 400. The clamping device 430 is configured to prevent a movement of the at least one heat transferring device 300 out of the at least one hole 420 of the tray 400 and to press the at least one heat transferring device 300 against the at least one electronic component 210 by a defined contact pressure.

The tray 400 is configured as a monolithic subassembly for the FTTdp distribution point equipment and incorporates heatsink fixation, cable routing and splice protection functionality in a single, injection-molded part. The monolithic integration of heatsink fixation, cable routing and splice protection functionality compared to individual parts for each functionality provides a reduction of required enclosure volume, and thus increases acceptance from the customers who have to deal with limited sizes of legacy handholds for the deployment of the FTTdp equipment. It further reduces the complexity of the assembly and thus reduces the device costs.

What is claimed is:

1. A distribution point unit for coupling an external electrical and optical cable, comprising:
    a casing comprising a first port to receive the external optical cable and a second port to receive the external electrical cable,
    an electronic board comprising at least one electronic component for processing optical and/or electrical signals, wherein the electronic board is housed within the casing,
    at least one heat transferring device having a first section with a first end and an adjacent second section with a second end, wherein the at least one heat transferring device is housed by the casing, a tray arranged above the electronic board, wherein the tray comprises at least one hole completely penetrating the tray from an upper surface of the tray to an opposite lower surface of the tray directed to the electronic board to receive the second section of the at least one heat transferring device, wherein the tray is housed by the casing, wherein the first end of the at least one heat transferring device is thermally coupled to the at least one electronic component, wherein the second end of the at least one heat transferring device is thermally coupled to the casing.

2. The distribution point unit of claim 1, comprising:
a thermal bridging material arranged within the casing between the second end of the at least one heat transferring device and the casing to thermally couple the at least one heat transferring device to the casing.

3. The distribution point unit of claim 2, wherein the thermal bridging material is configured as a compressible thermally conductive pad arranged in a gap between the second end of the at least one heat transferring device and the casing.

4. The distribution point unit of claim 1, comprising:
at least one spacer being arranged between the tray and the electronic board to arrange the tray in a distance defined by the at least one spacer away from the electronic board.

5. The distribution point unit of claim 4, wherein the at least one spacer is configured as a post having a first end section penetrating the tray and a second end section penetrating the electronic board, wherein the first end section of the post comprises an expanded head arranged above the upper surface of the tray to fix the post to the tray, wherein the second end section of the post comprises a self-locking means to fix the post to the electronic board.

6. The distribution point unit of claim 1, wherein the tray and the at least one heat transferring device are configured such that the at least one heat transferring device is pressed against the at least one electronic component.

7. The distribution point unit of claim 1, wherein a cross section of the first section of the at least one heat transferring device being perpendicularly oriented to the longitudinal direction of the at least one heat transferring device has a larger area than a cross section of the second section of the at least one heat transferring device being perpendicularly oriented to the longitudinal direction of the at least one heat transferring device.

8. The distribution point unit of claim 7, wherein the cross section of the at least one hole of the tray being perpendicularly oriented to the longitudinal direction of the second section of the at least one heat transferring device has a smaller area than the area of the cross section of the first section of the at least one heat transferring device.

9. The distribution point unit of claim 1, wherein the at least one heat transferring device is pressed by the lower surface of the tray against the at least one electronic component by a contact pressure.

10. The distribution point unit of claim 1,
wherein the tray comprises a clamping device arranged at the upper surface of the tray,
wherein the clamping device is configured to prevent a movement of the at least one heat transferring device out of the at least one hole of the tray and to press the at least one heat transferring device against the at least one electronic component by a contact pressure.

11. The distribution point unit of claim 1, wherein the tray comprises a cable routing device arranged on the upper surface of the tray.

12. The distribution point unit of claim 1, wherein an internal optical cable is arranged within the casing, coupled to the external optical cable at a splicing area of the external and internal optical cable,
wherein the tray comprises a splice protection device,
wherein the splicing area is held at the tray by the splice protection device, and
wherein the splice protection device is configured as a structure with grooves to insert the splicing area of the external optical cable and the internal optical cable.

13. The distribution point unit of claim 1, wherein the at least one heat transferring device is configured as a block of a thermally conductive material.

14. The distribution point unit of claim 1, wherein the electronic board and the tray are hermetically sealed in the casing.

15. The distribution point unit of claim 1, wherein the tray is formed as a monolithic component including a splice protection device and a cable routing device.

* * * * *